United States Patent
Grundy

(10) Patent No.: US 6,753,725 B2
(45) Date of Patent: Jun. 22, 2004

(54) LOW PASS FILTER

(75) Inventor: David L. Grundy, Grassgroft (GB)

(73) Assignee: Fast Analog Solutions Limited (GB)

( * ) Notice: Subject to any disclaimer, the term of this patent is extended or adjusted under 35 U.S.C. 154(b) by 0 days.

(21) Appl. No.: 10/193,061

(22) Filed: Jul. 10, 2002

(65) Prior Publication Data

US 2003/0128069 A1 Jul. 10, 2003

(51) Int. Cl.[7] .............................................. H03K 5/00
(52) U.S. Cl. ..................... 327/558; 327/350; 327/351
(58) Field of Search ................................. 327/558, 350, 327/351, 352, 551, 552, 553; 331/108, 127

(56) References Cited

U.S. PATENT DOCUMENTS

| | | | |
|---|---|---|---|
| 4,383,230 A | | 5/1983 | Manzolini |
| 4,430,626 A | * | 2/1984 | Adams ....................... 331/108 |
| 5,396,188 A | * | 3/1995 | Aoki ........................... 327/552 |
| 5,526,058 A | * | 6/1996 | Sano et al. ................. 348/647 |
| 5,572,162 A | | 11/1996 | Cotreau |

FOREIGN PATENT DOCUMENTS

| | | |
|---|---|---|
| EP | 0 339 819 A2 | 4/1988 |
| WO | 98/10362 | 3/1998 |

OTHER PUBLICATIONS

TRAC User Guide (containing D.L. Grundy: "A Computational Approach to VLSI Analogue Design", Journal of VLSI Signal Processing 8, 53–60, 1994).

* cited by examiner

Primary Examiner—Timothy P. Callahn
Assistant Examiner—Hiep Nguyen
(74) Attorney, Agent, or Firm—Foley & Lardner LLP

(57) ABSTRACT

A voltage controlled low pass filter comprising first and second circuits connected in series between a filter input and a filter output and a third circuit for adding a DC bias voltage to the filter input with AC signals to be filtered. The first circuit has a gain inversely related to the DC bias voltage and is operative to convert any signal applied to the filter input into a first circuit output signal which is a logarithmic function of the applied signal. The second circuit has a gain directly related to the DC bias voltage such that the overall gain of the first and second circuits is unity. The second circuit also has a bandwidth which is inversely related to the gain of the second circuit, and is operative to convert the first circuit output signal into a signal at the filter output which is an exponential function of the first circuit output signal. The filter has a cut off frequency which is dependent upon the DC bias voltage and the filter output signal is a replica of the signal applied to the filter input for frequencies below the cut-off frequency.

6 Claims, 3 Drawing Sheets

LOW PASS FILTER

The present invention relates to a low pass filter and in particular to a voltage controlled low pass filter.

Low pass filters are used to pass DC and AC signals at frequencies below a cut off frequency and to attenuate AC signals at a frequency above the cut off frequency. They have many applications and may be constructed in many different ways. Generally, voltage controlled low pass filters comprise components some or all of which are discreet components rather than being on-chip integrated components. This has been considered necessary to achieve adequate control of the relationship between the controlling voltage and the filter cut-off frequency. Clearly it would be desirable to manufacture such filters from components all on a single chip so as to reduce size, power consumption and unit costs but it is known to be difficult to manufacture on-chip components the electrical parameters of which are sufficiently accurately determined to provide predictable performance in an analogue circuit such as a voltage controlled low pass filter.

International patent application number PCT/GB97/02336 the content of which is incorporated herein by reference, describes field programmable analogue devices incorporating functional components from which it is possible to assemble many different circuits including for example a single pole filter, an integrating oscillator, a voltage controlled oscillator and a frequency doubler. The functional components include sub-circuits corresponding functionally to add, negate, log, exp (antilog), differentiate and integrate. A single pole filter can be produced by combining add, integrate and negate circuits such that an input signal to be filtered is applied to an add functional component, the output of that component is applied to the input of an integrator component, and the output of that component provides the filtered output signal which is fed back via the negate component to a second input of the add component. Details of such a circuit have been published in promotional material distributed in July 1997 (the TRAC user guide published by Zetex Plc of Fields New Road, Chadderton, Oldham, OL9 8NP, United Kingdom). That published material also includes a copy of the paper "A Computational Approach to VLSI Analogue Design", D. L. Grundy, Journal of VLSI Signal Processing 8, 53–60 (1994). That paper describes the series connection of log and antilog functional components to demonstrate that the output of such an arrangement is a temperature-independent replica of a bipolar input signal. None of the published material however suggests how a voltage controlled low pass filter can be defined using on-chip components such as those described in the above mentioned international patent application number PCT/GB97/02336.

It is an object of the present invention to provide a voltage controlled low pass filter having predictable electrical characteristics using simple on-chip functional components.

According to the present invention, there is provided a voltage controlled low pass filter comprising first and second circuits connected in series between a filter input and a filter output and a third circuit for adding a DC bias voltage to the filter input with AC signals to be filtered, wherein the first circuit has a gain inversely related to the DC bias voltage, the first circuit is operative to convert any signal applied to the filter input into a first circuit output signal which is a logarithmic function of the applied signal, the second circuit has a gain directly related to the DC bias voltage such that the overall gain of the first and second circuits is unity, the second circuit has a bandwidth which is inversely related to the gain of the second circuit, and the second circuit converts the first circuit output signal into a signal at the filter output which is an exponential function of the first circuit output signal, whereby the filter has a cut off frequency which is dependent upon the DC bias voltage and the filter output signal is a replica of the signal applied to the filter input for frequencies below the cut off frequency.

Given that the second circuit has a bandwidth which is inversely related to the gain of the second circuit, and that gain is directly related to the DC bias voltage, changes in the DC bias voltage cause proportional changes in the cut-off frequency of the low pass filter. Thus, simply by adjusting the DC bias voltage the cut off frequency of the low pass filter can be controlled. The DC bias voltage can be selected such that the filter circuit is non-inverting. As a result, a plurality of filter circuits may be connected in series with each of the filter circuits comprising a first and second circuit, thereby achieving overall cut-off frequency control by the application of a single DC bias voltage to the first filter circuit in the series.

The first circuit may comprise an amplifier having an inverting input connected by a series resistor to the filter input and an output connected to the second circuit, a diode being connected between the non-inverting input and the output of the first circuit amplifier. The second circuit may comprise an amplifier having an inverting input connected by a series diode to the first circuit and an output connected to the filter output, a resistor being connected between the non-inverting input and output of the second circuit amplifier. By appropriate selection of the components making up the first and second circuits, the required overall unity gain can be maintained whilst retaining the ability to adjust the cut-off frequency of the filter by the application of a single DC bias voltage.

An embodiment of the present invention will now be described, by way of example, with reference to the accompanying drawings, in which.

Figure 1:
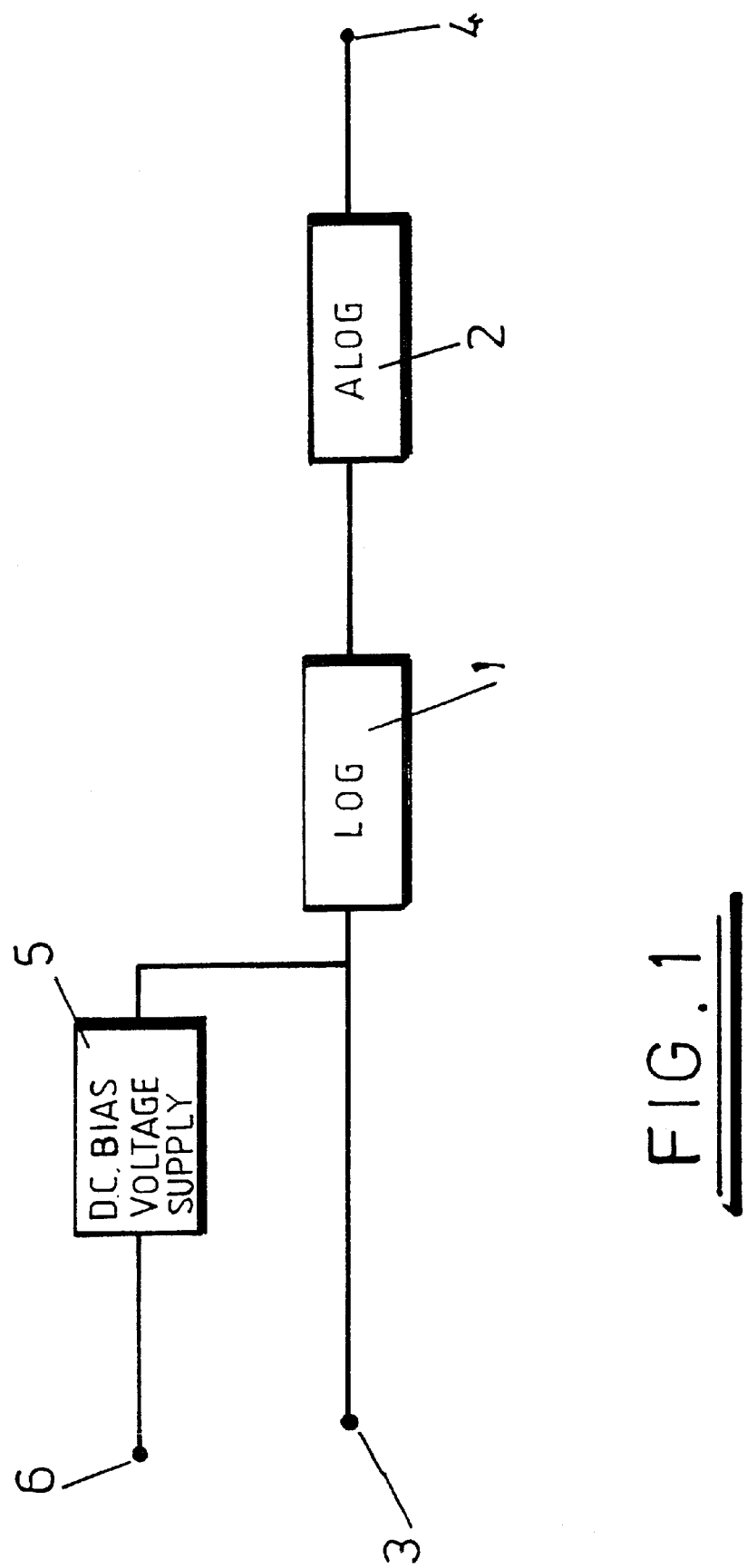
FIG. 1 is a schematic representation of a low pass filter circuit in accordance with the present invention.

Referring to FIG. 1, the illustrated low pass filter circuit comprises a first circuit 1 connected in series with a second circuit 2 between a filter input 3 and a filter output 4. A third circuit 5 provides a DC bias voltage which is combined with an AC signal to be filtered applied to input 3. The DC voltage output by the circuit 5 is controlled by a control signal applied to input 6.

The first circuit 1 has a gain inversely related to the DC bias voltage applied to input 3. The circuit 1 is operative to convert the combined signals applied to its input into a first circuit output signal which is a logarithmic function of the combined applied signal. The second circuit 2 has a gain directly related to the DC bias voltage such that the overall gain of the first and second circuits is unity. Thus signals appearing at the output 4 are a replica of signals applied to the input of the first circuit 1. The second circuit 2 has a bandwidth which is inversely related to the gain of the second circuit. The second circuit 2 converts the first circuit output signal into a signal at the filter output 4 which is an exponential function of the first circuit output signal which is input to the second circuit 2. Thus the filter has a cut off frequency which is dependent upon the DC bias voltage applied by the third circuit 5. The filter output signal is therefore a replica of the signal applied to the input of the first circuit 1 but only in respect of frequencies below the cut-off frequency which is defined by the bandwidth of the second circuit 2.

Figure 2:
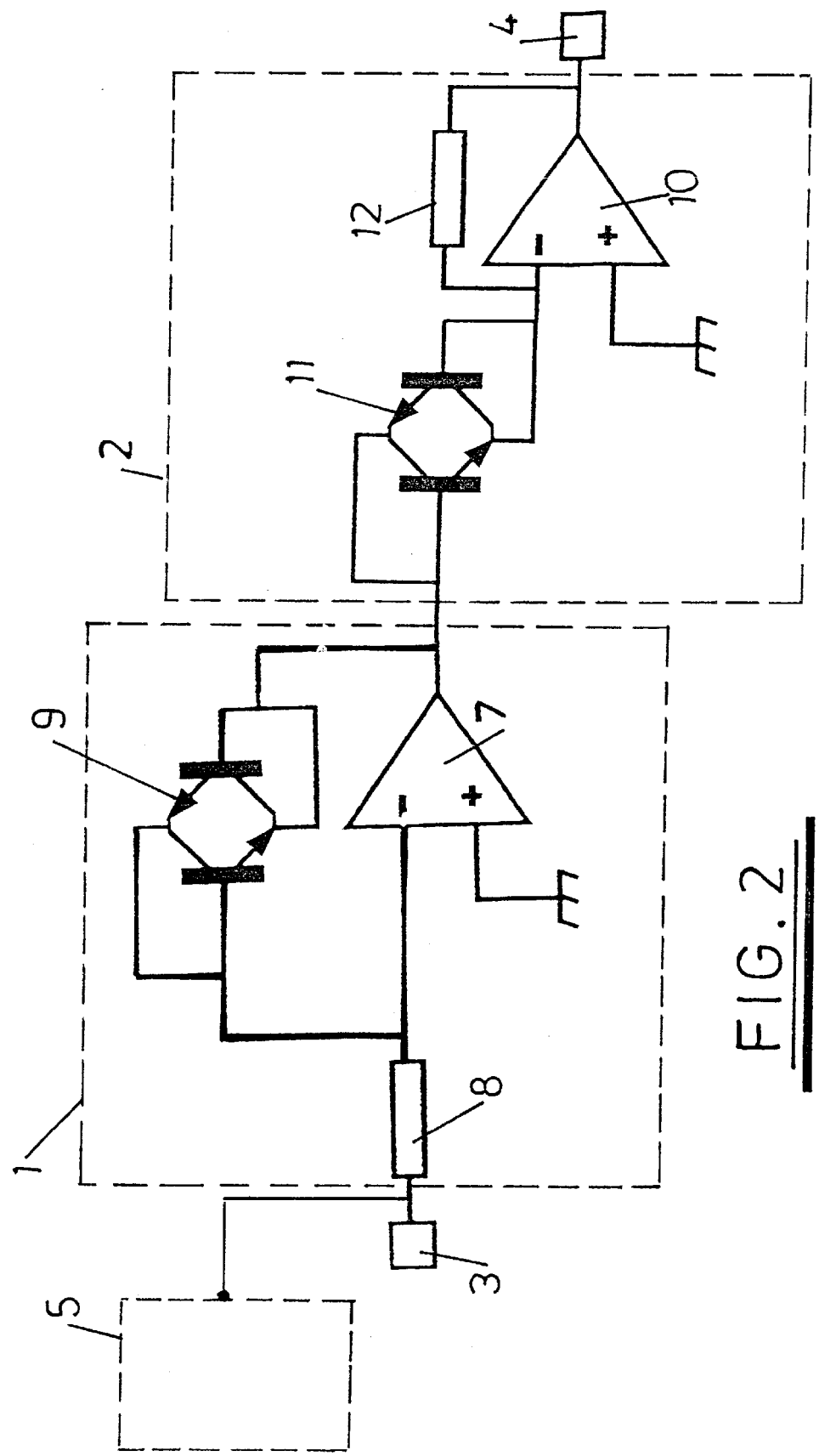
FIG. 2 is a more detailed schematic representation of component parts of the circuit shown in FIG. 1.
Figure 3:
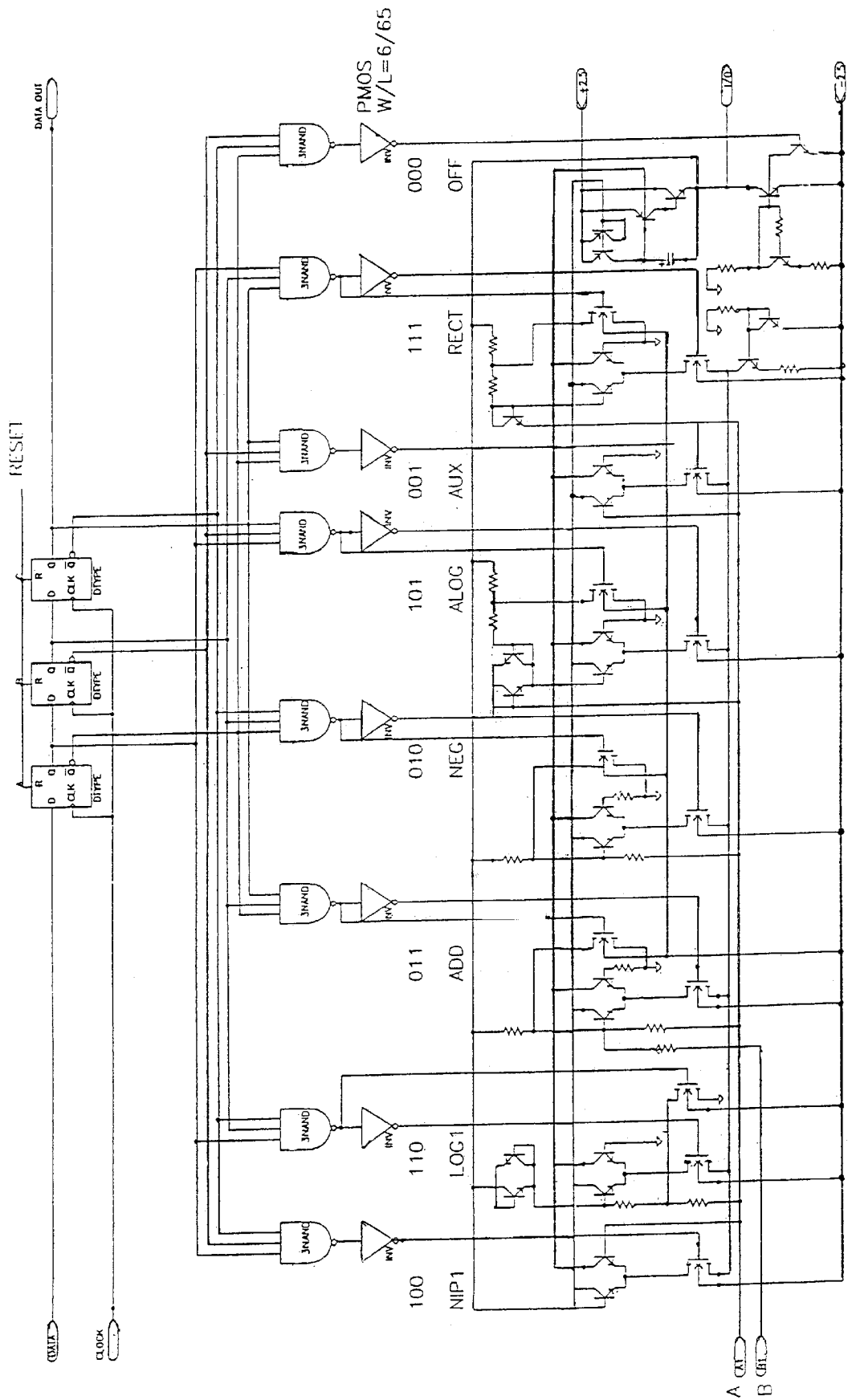
FIG. 3 illustrates circuits described in detail in international patent application number PCT/GB97/02336 which may be used to define a circuit such as that illustrated in FIG. 2.

Referring to FIG. 2, the reference numerals 1 to 5 are used to indicate the components identified by the same reference numerals in FIG. 1. The logarithmic function circuit 1 comprises an operational amplifier 7 the inverting input of which is connected to the combined outputs of the AC signal input 3 and the DC bias voltage supply 5 by a resistor 8. A back-to-back junction assembly 9 in the illustrated configuration operates as a diode. The second circuit 2 comprises an operational amplifier 10 the inverting input of which is connected to the output of the circuit 1 by a back-to-back junction assembly 11 again acting as a diode. A resistor 12 is connected between the output of the amplifier 10 and the non-inverting input of the amplifier 10.

The assembly illustrated in FIG. 1 represents a single pole low pass filter. In use an AC signal eo is applied to the input 3 and combined with the DC bias voltage Edc before application to the resistor 8. The value of the DC bias voltage Edc is greater than the peak to peak value of the AC signal eo. The first circuit 1 operates such that it delivers an output signal Eo1 given by:

$$Eo1 = kT/q(\log(Edc+eo)/RJ_o + 1)$$

where
k=Boltzmann's constant
T=absolute temperature
q=electronic charge
$I_o$=saturation current (diode junction 9)
R=resistance (resistor 8)

The signal Eo1 is converted by the second circuit 2 into a signal Eoa given by:

$$Eoa = -I_o R \exp(q/kT - 1(kT/q\log(Edc+eo)/RI_o + 1))$$

or:

$$Eoa = Edc + eo$$

given that $(KT-1)/KT$ and $I_o R/(RI_o + 1)$ are both substantially equal to unity.

Thus, at low frequency the output is substantially the same as the input. In addition, the currents through the two diodes defined by the back-to-back junctions 9 and 12 are identical (assuming these components have substantially identical characteristics which will be the case if they are formed on a single chip), the diode currents being equal to:

$$Edc/R$$

Assuming small signal AC conditions apply, the gain for the log function of the first circuit 1 is:

$$G\log = re/R$$

where re is a small signal slope resistance of the diode given by 0.025/Idc where Idc is the DC current through the diode given by Edc/R, hence:

$$re = 0.025 R/Edc$$

and:

$$G\log = 0.025/Edc$$

Similarly, the gain for the exponential (antilog) function of the second circuit 2 is:

$$Ga\log = Edc/0.025$$

The gain for the two functions (log and antilog) combined is:

$$G\log \, Ga\log = (0.025/Edc)(Edc/0.025) = 1$$

Thus it can be seen that with Edc=25 millivolts the gain of both the log and antilog functions is unity. With other values of the applied DC bias voltage Edc, although the overall gain is still unity, the contributions to that gain of the log circuit 1 and the antilog circuit 2 are quite different. For example, if Edc is equal to 1 volt, then the log function first circuit 1 has a gain of 0.025 whereas the antilog function circuit 2 has a gain of 40.

It is this feature which delivers the voltage control of the cut-off frequency of the filter. Since the analogue function second circuit 2 has finite gain bandwidth, the gain of that circuit can only be increased for example to 40 at the expense of a reduction in the bandwidth of the circuit. Thus the filter can be tuned by variations in the value of the control voltage Edc. The higher the bias voltage, the lower the cut-off frequency.

Given that the filter circuit as a whole has a gain of unity, and is non-inverting, a series of low pass filters as represented by the first and second circuits 1, 2, can be connected in series so that the filter comprises a cascaded series of filters to provide whatever order filter is required. The DC bias control voltage will ripple through the series of filter sections, thus tuning all of the sections. It is sufficient therefore to apply the DC bias voltage only to the first of the filter circuits in the series. Thus a high order low pass filter may be produced without any need for external components.

It will be appreciated that, although the present invention has been described in the context of field programmable analogue devices of the type described in international patent specification number PCT/GB97/02336, the invention could be implemented using other components and in some circumstances may incorporate off-chip components. In general however it is expected that the invention will be implemented entirely with on-chip components such as those described in the above international patent application.

What is claimed is:

1. A voltage controlled low pass filter comprising first and second circuits connected in series between a filter input and a filter output and a third circuit for adding a DC bias voltage to the filter input with AC signals to be filtered, wherein the first circuit has a gain inversely related to the DC bias voltage, the first circuit is operative to convert any signal applied to the filter input into a first circuit output signal which is a logarithmic function of the applied signal, the second circuit has a gain directly related to the DC bias voltage such that the overall gain of the first and second circuits is unity, the second circuit has a bandwidth which is inversely related to the gain of the second circuit, and the second circuit converts the first circuit output signal into a signal at the filter output which is an exponential function of the first circuit output signal, whereby the filter has a cut off frequency which is dependent upon the DC bias voltage and the filter output signal is a replica of the signal applied to the filter input for frequencies below the cut off frequency.

2. A filter according to claim 1, wherein the first circuit comprises an amplifier having an inverting input connected by a series resistor to the filter input and an output connected to the second circuit, and a diode connected between the inverting input and output of the first circuit amplifier.

3. A filter according to claim 1, wherein the second circuit comprises an amplifier having an inverting input connected by a series diode to the first circuit and an output connected to the filter output, and a resistor connected between the inverting input and output of the second circuit amplifier.

4. A filter according to claim 2, wherein the second circuit comprises an amplifier having an inverting input connected by a series diode to the first circuit and an output connected to the filter output, and a resistor connected between the inverting input and output of the second circuit amplifier.

5. A filter according to claim 1, wherein the DC voltage is selected to ensure that the filter circuit is non-inverting.

6. A filter according to claim 4, wherein a plurality of filter circuits each comprising a first and second circuit are connected in series, the third circuit providing the DC bias voltage being connected only to the first filter circuit in the series.

* * * * *